United States Patent
Peng et al.

(10) Patent No.: US 10,699,799 B2
(45) Date of Patent: Jun. 30, 2020

(54) METHOD OF TRAINING ARTIFICIAL INTELLIGENCE TO ESTIMATE SENSING VOLTAGES FOR STORAGE DEVICE

(71) Applicant: STORART TECHNOLOGY CO., LTD., Hsinchu (TW)

(72) Inventors: Hsiang-En Peng, Hsinchu (TW); Sheng-Han Wu, Hsinchu (TW)

(73) Assignee: STORART TECHNOLOGY (SHENZHEN) CO., LTD., Shenzhen, Guangdong (CN)

(*) Notice: Subject to any disclaimer, the term of this patent is extended or adjusted under 35 U.S.C. 154(b) by 0 days.

(21) Appl. No.: 16/267,398

(22) Filed: Feb. 5, 2019

(65) Prior Publication Data
US 2020/0105361 A1  Apr. 2, 2020

(30) Foreign Application Priority Data
Sep. 28, 2018 (TW) .............................. 107134387 A

(51) Int. Cl.
| G11C 29/00 | (2006.01) |
| G11C 29/50 | (2006.01) |
| G06F 11/30 | (2006.01) |
| G06N 20/00 | (2019.01) |
| G06N 3/08 | (2006.01) |

(52) U.S. Cl.
CPC .... *G11C 29/50004* (2013.01); *G06F 11/3058* (2013.01); *G06N 3/08* (2013.01); *G06N 20/00* (2019.01); *G11C 2029/5004* (2013.01)

(58) Field of Classification Search
CPC ...... G11C 29/50004; G11C 2029/5004; G06F 11/3058; G06N 20/00; G06N 3/08
See application file for complete search history.

(56) References Cited

U.S. PATENT DOCUMENTS

| 10,573,393 B1* | 2/2020 | Peng ..................... H03M 13/45 |
| 2015/0043282 A1* | 2/2015 | Shin .................... G11C 11/5642 |
| | | 365/185.21 |

* cited by examiner

*Primary Examiner* — Samir W Rizk
(74) *Attorney, Agent, or Firm* — Li & Cai Intellectual Property (USA) Office

(57) ABSTRACT

A method of training artificial intelligence to estimate sensing voltages for a storage device is provided, which includes steps of: supplying initial sensing voltages to memory units; defining various storing states; comparing threshold voltages of the memory units with the initial sensing voltages to classify the memory units; calculating a ratio of the number of the memory units in a strong correct region to the number of in the strong correct region and a weak correct region; calculating a ratio of the number of the memory units in a strong error region to the number of in the strong error region and a weak error region; calculating the number of the memory units in the weak correct and error regions to obtain a histogram parameter; inputting the ratios and parameter to an artificial intelligence neural network; and using machine learning to analyze practical sensing voltages.

10 Claims, 9 Drawing Sheets

METHOD OF TRAINING ARTIFICIAL INTELLIGENCE TO ESTIMATE SENSING VOLTAGES FOR STORAGE DEVICE

CROSS-REFERENCE TO RELATED PATENT APPLICATION

This application claims the benefit of priority to Taiwan Patent Application No. 107134387, filed on Sep. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a storage device, and more particularly to a method of training artificial intelligence to estimate sensing voltages for a storage device.

BACKGROUND OF THE DISCLOSURE

Memories are seeing widespread use in recent years. However, memories may be damaged by multiple times of erasing and writing data, resulting in an increased probability of error and a significantly reduced reliability of the non-volatile memory. Therefore, it is necessary to improve the reliability of the non-volatile memory by supplying design techniques such as error correction techniques, such that a lifetime of a product can be prolonged and an operation state of the product can be more stable.

An error correction module for correcting error data read by the non-volatile memory is disposed in a control circuit of the memory to eliminate error caused by external factors in the non-volatile memory, thereby prolonging the lifetime of the non-volatile memory. A common error correction coding technology, such as a Bose-Chaudhuri-Hocquenghem (BCH) coding technology, is capable of fast computation and has a correction capability that increases with the increase of the number of redundant bits. However, the BCH coding technology cannot keep up with the manufacturing technologies of the non-volatile memory which have been greatly improved and cannot provide sufficient correction capability. Therefore, a Low Density Parity Code (LDPC) error correction technology widely used in the field of communication and having a strong correction capability is now being used in data storage.

SUMMARY OF THE DISCLOSURE

In response to the above-referenced technical inadequacies, the present disclosure provides a method of training artificial intelligence to estimate sensing voltages for a storage device including a plurality of memory units each storing one or more bit values. The method includes the following steps: (a) supplying a plurality of initial sensing voltages having different voltage values to each of the memory units; (b) defining a plurality of storing states including a strong correct region, a weak correct region, a strong error region and a weak error region; (c) comparing the initial sensing voltages with the threshold voltage of each of the memory units, and accordingly classifying each of the memory units into the strong correct region, the weak correct region, the strong error region or the weak error region; (d) calculating a strong correct ratio of the number of the memory units classified in the strong correct region to the number of the memory units classified in the strong correct region and the weak correct region; (e) calculating a strong error ratio of the number of the memory units classified in the strong error region to the number of the memory units classified in the strong error region and the weak error region; (f) calculating the number of the memory units classified in the weak correct region and the weak error region to obtain a histogram parameter; (g) inputting the strong correct ratio, the strong error ratio and the histogram parameter to an artificial intelligence neural network system; and (h) using machine learning to adjust the initial sensing voltages based on the strong correct ratio, the strong error ratio and the histogram parameter to generate a plurality of practical sensing voltages replacing the initial sensing voltages, and then returning to step (a).

As described above, the present disclosure provides the method of training artificial intelligence to estimate the sensing voltages for the storage device, by which the initial sensing voltages are adjusted to generate the practical sensing voltages to be supplied to the memory units. The memory units are more precisely classified into the storing states including the strong correct, the weak correct, the strong error and the weak error, etc., based on the practical sensing voltages. It is worth noting that the number of the memory units classified in the strong error region based on the practical sensing voltage can be significantly reduced. Therefore, the success probability of decoding the bit values stored in the memory units by executing a probability decoding algorithm such as a low density parity check code or other algorithms by the decoder can be increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
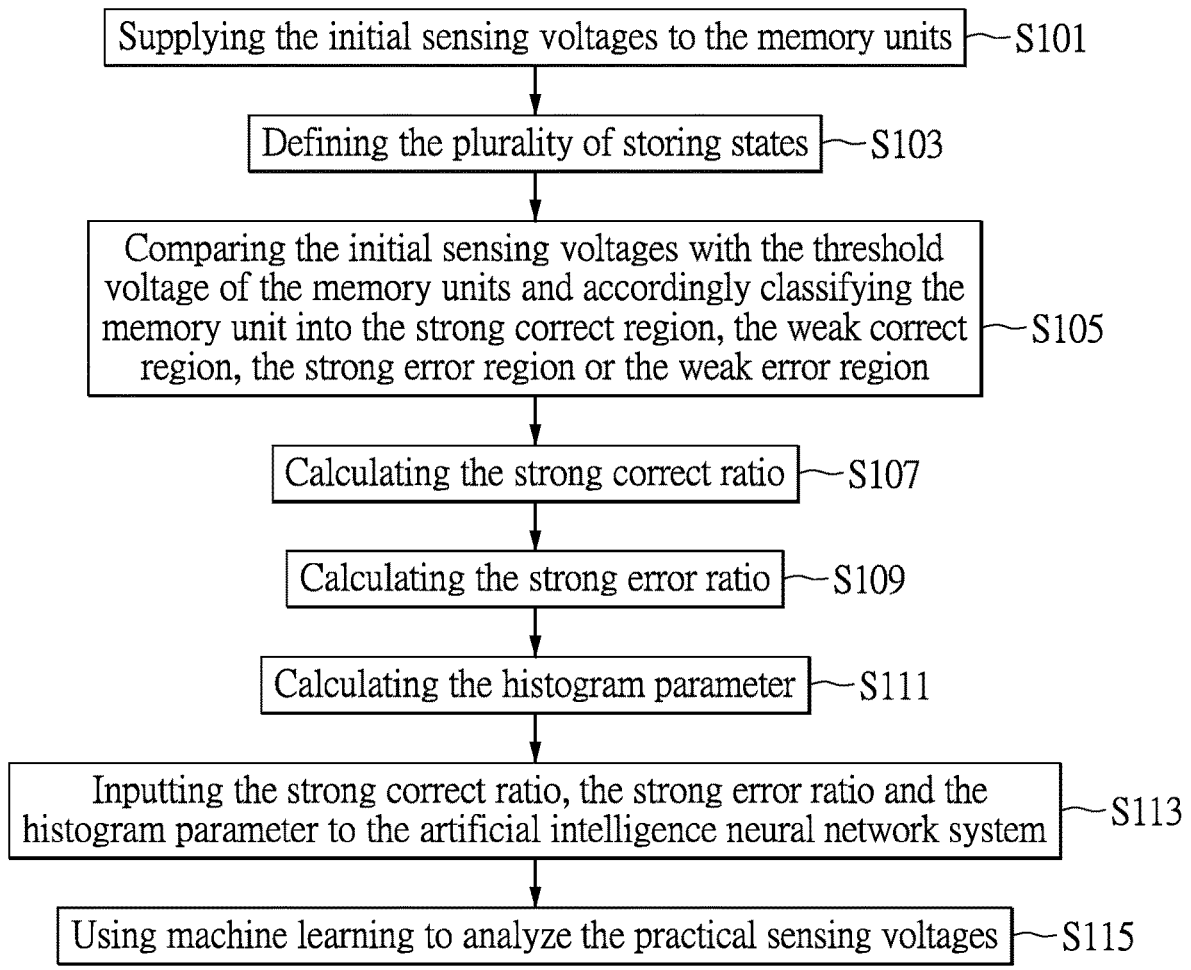
FIG. 1 is a flowchart of a method of training artificial intelligence to estimate sensing voltages for a storage device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 8:
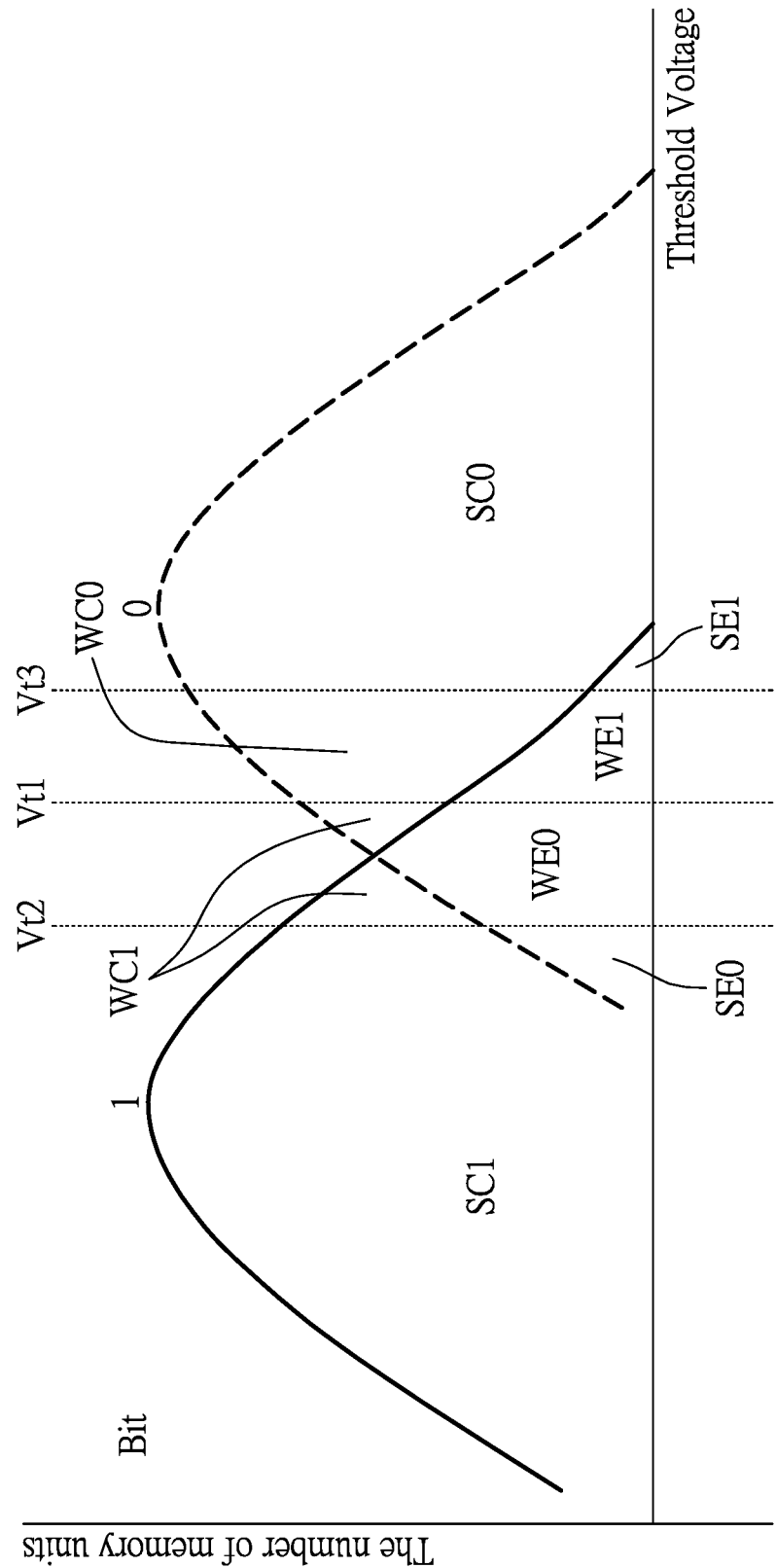
FIG. 8 is a graph of the number of memory units of the storage device to which initial sensing voltages estimated by using the method of training artificial intelligence are supplied verse threshold voltages of the memory units according to the embodiments of the present disclosure.

Reference is made to FIGS. 1 and 8. FIG. 1 is a flowchart of a method of training artificial intelligence to estimate sensing voltages for a storage device according to a first embodiment of the present disclosure; FIG. 8 is a graph of the number of memory units of the storage device to which initial sensing voltages estimated by using the method of training artificial intelligence are supplied verse threshold voltages of the memory units according to the embodiments of the present disclosure.

As shown in FIG. 1, the method of training artificial intelligence to estimate the sensing voltages for the storage device includes steps S101 to S115. The storage device includes a plurality of memory units, and each of the plurality of memory units stores one or more bit values each of which is logic "0" or "1".

In step S101, the initial sensing voltages are supplied to the memory units and have different voltage values.

For example, as shown in FIG. 8, three initial sensing voltages Vt1, Vt2, Vt3 are supplied to the memory units. The initial sensing voltage Vt3 is larger than the initial sensing voltage Vt1. The initial sensing voltage Vt2 is smaller than the initial sensing voltage Vt1. It should be understood that the number of the supplied initial sensing voltages can be adjusted according to actual requirement, for example, according to the number of regions of storing states into which the memory units are classified, but the present disclosure is not limited thereto.

In step S103, the plurality of storing states including a strong correct (SC) region, a weak correct (WC) region, a strong error (SE) region and a weak error (WE) region are defined.

In step S105, the threshold voltage of the memory unit is compared with the initial sensing voltages, and accordingly the memory unit is classified into the strong correct region, the weak correct region, the strong error region or the weak error region.

As shown in FIG. 8, an entire region formed by two curves respectively represent the bit values Bit of logic "1" and "0" is divided into the regions of the storing states based on the initial sensing voltages Vt1, Vt2, Vt3.

The curve representing the bit value of logic "1" is used for the classification of the memory unit that intends to store the bit value of logic "1". For example, the memory unit is classified into a strong correct region SC1, a weak correct region WC1, a strong error region SE1 or a weak error region WE1.

On the other hand, the curve representing the bit value Bit of logic "0" is used for the classification of the memory unit that intends to store the bit value of logic "0". For example, the memory unit is classified into a strong correct region SC0, a weak correct region WC0, a strong error region SE0 or a weak error region WE0.

In step S107, a strong correct ratio (SCR) of the number of the memory units in the strong correct region to the number of the memory units in the strong and weak correct regions is calculated, which is expressed by the following equation:

$$SCR = \frac{SC}{SC + WC}$$

wherein SCR represents the strong correct ratio, SC represents the number of the memory units in the strong correct region, and WC represents the number of the memory units in the weak correct region.

The memory unit intending to store the bit value Bit of logic "1" may be classified into the strong correct region SC1 or the weak correct region WC1 as shown in FIG. 8. An area of the strong correct region SC1 and an area of the weak correct region WC1 are respectively calculated and then summed up. Finally, the strong correct ratio of the area of the strong correct region SC1 to the sum area of the strong correct region SC1 and the weak correct region WC1 is calculated.

In addition, the memory unit intending to store the bit value Bit of logic "0" may be classified into the strong correct region SC0 or the weak correct region WC0 as shown in FIG. 8. An area of the strong correct region SC0 and an area of the weak correct region WC0 are respectively calculated and then summed up. Finally, the strong correct ratio of the area of the strong correct region SC0 to the sum area of the strong correct region SC0 and the weak correct region WC0 is calculated.

In step S109, a strong error ratio (SER) of the number of the memory units in the strong error region to the number of the memory units in the strong and weak error regions is calculated, which is expressed by the following equation:

$$SER = \frac{SE}{SE + WE}$$

wherein SCR represents the strong error ratio, SE represents the number of the memory units in the strong error region, and WE represents the number of the memory units in the weak error region.

The memory unit intending to store the bit value Bit of logic "1" may be classified into the strong error region SE1 or the weak error region WE1 as shown in FIG. 8. An area of the strong error region SE1 and an area of the weak error region WE1 are respectively calculated and then summed up. Finally, the strong error ratio of the area of the strong error region SE1 to the sum area of the strong error region SE1 and the weak error region WE1 is calculated.

The memory unit intending to store the bit value Bit of logic "0" may be classified into the strong correct region SC0 or the weak correct region WC0 as shown in FIG. 8. An area of the strong error region SE0 and an area of the weak error region WE0 are respectively calculated and then summed up. Finally, the strong error ratio of the area of the strong error region SE0 to the sum area of the strong error region SE0 and the weak error region WE0 is calculated.

In step S111, the number of the memory units classified into the weak correct region and the number of the memory units classified into the weak error region are summed up to obtain a histogram parameter.

For example, the area of the weak correct region WC1 corresponding to the curve representing the bit value of logic "1" as shown in FIG. 8 is calculated. The area of the weak error region WE0 corresponding to the curve representing the bit value of logic "0" as shown in FIG. 8 is calculated. The area of the weak correct region WC1 and the area of the weak error region WE0 are summed up to obtain a first sub-histogram parameter. That is, the first sub-histogram parameter is equal to a sum of the number of the memory units classified in the weak correct region WC1 and the number of the memory units classified in the weak error region WE0. In addition, the area of the weak correct region WC0 corresponding to the curve representing the bit value of logic "0" as shown in FIG. 8 is calculated. The area of the weak error region WE1 corresponding to the curve representing the bit value of logic "1" as shown in FIG. 8 is calculated. The area of the weak correct region WC0 and the area of the weak error region WE1 are summed up to obtain a second sub-histogram parameter.

Alternatively, the area of the weak correct region WC1 and the area of the weak error region WE1 which correspond to the curve representing the bit value of logic "1" as shown in FIG. 8 are summed up to obtain the first sub-histogram parameter HM1. In addition, the area of the weak correct region WC0 and the area of the weak error region WE0 which correspond to the curve representing the bit value of logic "0" as shown in FIG. 8 are summed up to obtain the second sub-histogram parameter.

In step S113, the two strong correct ratios that respectively correspond to the bit values Bit of logic "0" and "1" as shown in FIG. 8, the two strong error ratios that respectively correspond to the bit values Bit of logic "0" and "1" as shown in FIG. 8, the first sub-histogram parameter and second sub-histogram parameter are inputted to an artificial intelligence neural network system (AI-NN).

In step S115, the initial sensing voltages are adjusted based on the above strong correct ratio, strong error ratio and histogram parameter to generate practical sensing voltages by using machine learning.

Figure 2:
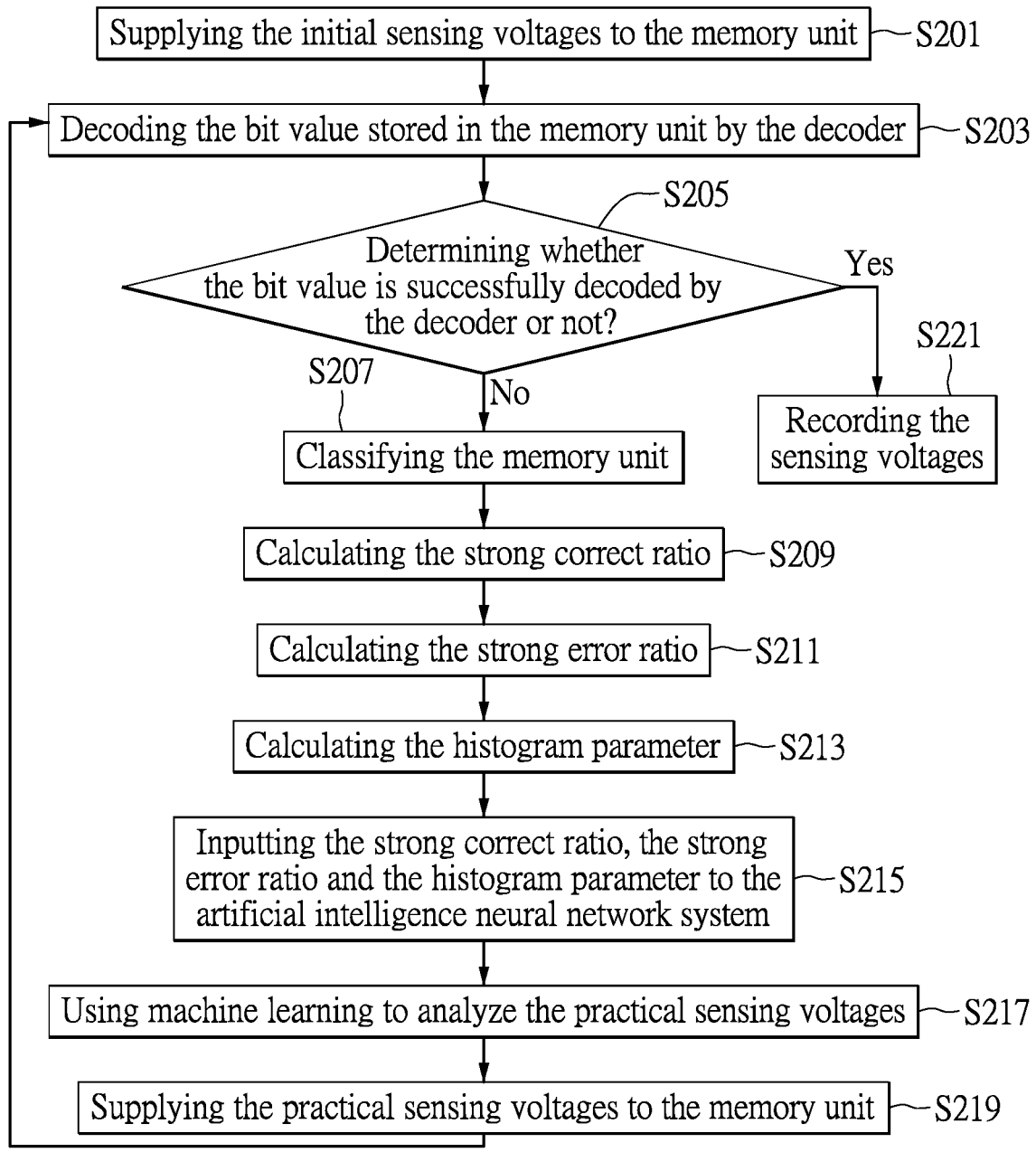
FIG. 2 is a flowchart of a method of training artificial intelligence to estimate sensing voltages for a storage device according to a second embodiment of the present disclosure.

Reference is made to FIG. 2, which is a flowchart of a method of training artificial intelligence to estimate sensing voltages for a storage device according to a second embodiment of the present disclosure. As shown in FIG. 2, the method of training artificial intelligence to estimate the sensing voltages for the storage device includes steps S201 to S221. The storage device includes the plurality of memory units and each of the plurality of memory units stores one or more bit values each of which is logic "0" or "1".

In step S201, the initial sensing voltages are supplied to the memory units and have different voltage values.

In step S203, the bit values stored in the memory unit are decoded by executing a decoding program based on the initial sensing voltages by the decoder.

In step S205, it is determined whether the bit value stored in the memory unit is successfully decoded by the decoder or not. If the bit value stored in the memory unit is not successfully decoded, steps S207 to S219 are sequentially performed. If the bit value stored in the memory unit is successfully decoded, step S221 is performed.

In step S207, the memory unit is reclassified into the strong correct region, the weak correct region, the strong error region or the weak error region.

In step S209, the strong correct ratio of the number of the memory units in the strong correct region to the number of the memory units in the strong and weak correct regions is calculated.

In step S211, the strong error ratio of the number of the memory units in the strong error region to the number of the memory units in the strong and weak error regions is calculated.

In step S213, the number of the memory units classified into the weak correct region and the number of the memory units classified into the weak error region are summed up to obtain the histogram parameter.

In step S215, the strong correct ratio, the strong error ratio and the histogram parameter are inputted to the artificial intelligence neural network system.

In step S217, the initial sensing voltages are adjusted based on the strong correct ratio, the strong error ratio and the histogram parameter to generate the practical sensing voltages by using machine learning.

In step S219, the practical sensing voltages are supplied to the memory units and have the different voltage values. Then, in step S203, the bit values stored in the memory unit are decoded by executing a decoding program based on the practical sensing voltages replacing the initial sensing voltages by the decoder.

In step S221, the sensing voltages by which the bit values stored in the memory unit are successfully decoded are recorded.

Figure 3:
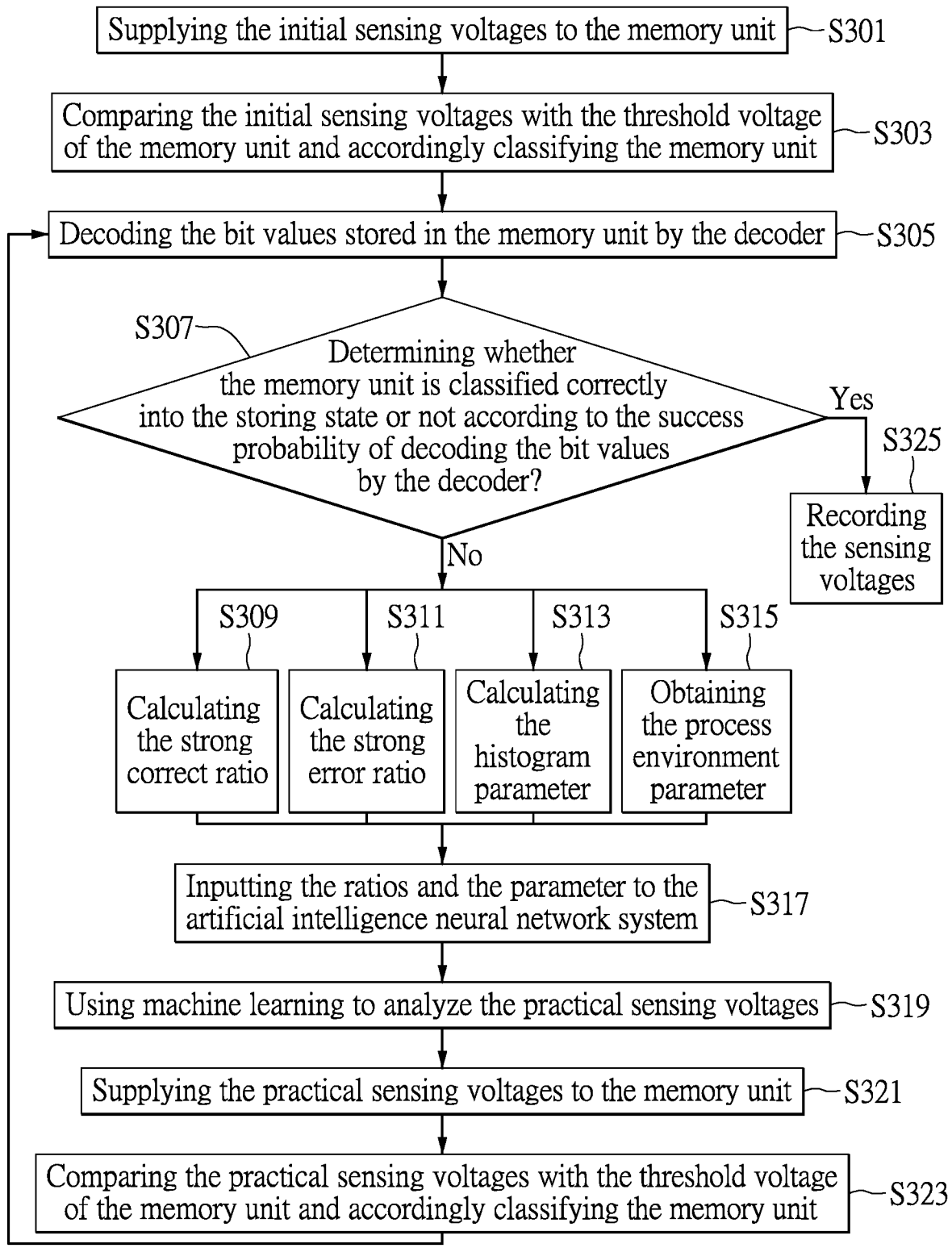
FIG. 3 is a flowchart of a method of training artificial intelligence to estimate sensing voltages for a storage device according to a third embodiment of the present disclosure.

Reference is made to FIG. 3, which is a flowchart of a method of training artificial intelligence to estimate sensing voltages for a storage device according to a third embodiment of the present disclosure. As shown in FIG. 3, the method of training artificial intelligence to estimate the sensing voltages for the storage device includes steps S301 to S325. The storage device includes the plurality of memory units and each of the plurality of memory units stores the one or more bit values each of which is logic "0" or "1".

In step S301, the initial sensing voltages are supplied to each of the memory units and have the different voltage values.

In step S303, the threshold voltage of the memory unit is compared with the initial sensing voltages, and accordingly the memory unit is classified into the strong correct region, the weak correct region, the strong error region or the weak error region.

In step S305, the bit values stored in the memory unit are decoded by the decoder.

In step S307, it is determined whether the memory units are correctly classified into the storing states based on the initial sensing voltages or not, according to a success probability of decoding the bit values by the decoder. If the memory units are correctly classified into the storing states, the initial sensing voltages are recorded and the memory units are still classified based on the initial sensing voltages. If the memory units are not classified correctly into the storing states, steps S309 to S323 are sequentially performed.

In step S309, the strong correct ratio of the number of the memory units in the strong correct region to the number of the memory units in the strong and weak correct regions is calculated.

In step S311, the strong error ratio of the number of the memory units in the strong error region to the number of the memory units in the strong and weak correct regions is calculated.

In step S313, the number of the memory units classified into the weak correct region and the number of the memory units classified into the weak error region are summed up to obtain the histogram parameter.

In step S315, a process environment variable associated with a process in which the storage device accesses the bit values is obtained.

In step S317, the process environment variable, the strong correct ratio, the strong error ratio and the histogram parameter are inputted to the artificial intelligence neural network system.

In step S319, the practical sensing voltages replacing the initial sensing voltages are analyzed, based on the process environment variable, the strong correct ratio, the strong error ratio and the histogram parameter by using machine learning.

In step S321, the practical sensing voltages are supplied to the memory units and have the different voltage values from each other. The practical sensing voltage may be different from the initial sensing voltage.

In step S323, the threshold voltage of the memory unit is compared with the practical sensing voltages, and accordingly the memory unit is classified into the strong correct region, the weak correct region, the strong error region or the weak error region. If a classification result of the memory units based on the practical sensing voltages is matched with a decoding result of the decoder, the practical sensing voltages are recorded, and the memory units are still classified based on the practical sensing voltages.

However, it should be understood that the threshold voltages of the memory units are variable values. The changed threshold voltages may cause the memory units to be incorrectly classified based on the practical sensing voltages. For example, in step S307, it is determined that the memory units are wrongly classified into the storing state based on the practical sensing voltages according to the success probability of decoding the bit values by the decoder. Under this condition, steps S307 to S323 are performed again to generate new practical sensing voltages and the memory units are classified into the different storing states based on the new practical sensing voltages.

Figure 4:
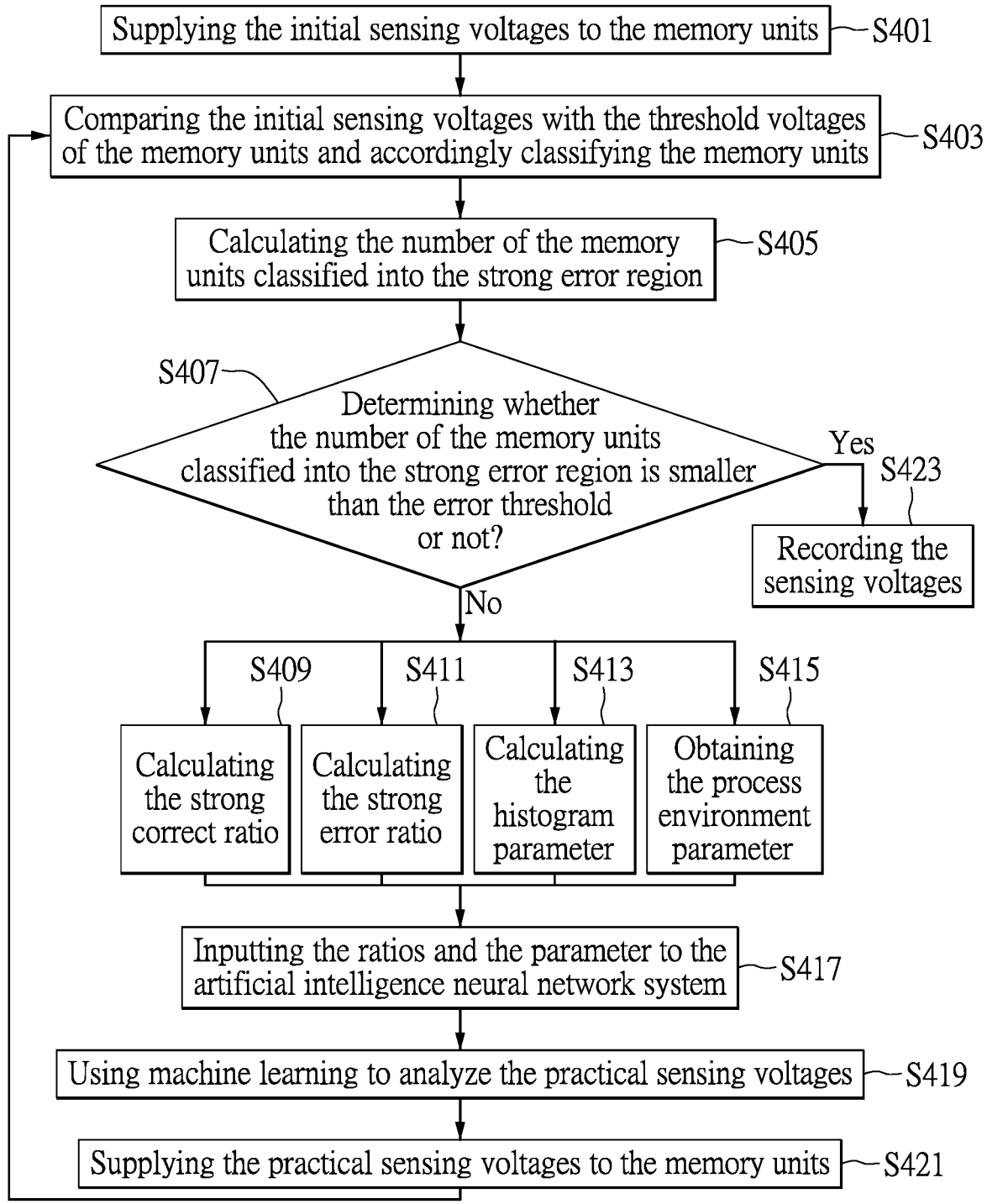
FIG. 4 is a flowchart of a method of training artificial intelligence to estimate sensing voltages for a storage device according to a fourth embodiment of the present disclosure.

Reference is made to FIG. 4, which is a flowchart of a method of training artificial intelligence to estimate sensing voltages for a storage device according to a fourth embodiment of the present disclosure. As shown in FIG. 4, the method of training artificial intelligence to estimate the sensing voltages for the storage device includes steps S401 to S423. The storage device includes the plurality of memory units and each of the plurality of memory units stores the one or more bit values each of which is logic "0" or "1".

In step S401, the initial sensing voltages are supplied to the memory units and have different voltage values.

In step S403, the threshold voltage of the memory unit is compared with the initial sensing voltages, and accordingly the memory unit is classified into the strong correct region, the weak correct region, the strong error region or the weak error region.

In step S405, the number of the memory units classified in the strong error region based on the initial sensing voltages is calculated.

In step S407, it is determined whether the number of the memory units classified in the strong error region based on the initial sensing voltages is smaller than an error threshold or not. If the number of the memory units classified in the strong error region is not smaller than the error threshold, steps S409 to S421 are sequentially performed. If the number of the memory units classified in the strong error region is smaller than the error threshold, step S423 is performed.

In step S409, the strong correct ratio of the number of the memory units in the strong correct region to the number of the memory units in the strong and weak correct regions is calculated.

In step S411, the strong error ratio of the number of the memory units in the strong error region to the number of the memory units in the strong and weak correct regions is calculated.

In step S413, the number of the memory units classified into the weak correct region and the number of the memory units classified into the weak error region are summed up to obtain the histogram parameter.

In step S415, the process environment variable associated with the process in which the storage device accesses the bit values is obtained.

In step S417, the process environment variable, the strong correct ratio, the strong error ratio and the histogram parameter are inputted to the artificial intelligence neural network system.

In step S419, the practical sensing voltages are analyzed based on the process environment variable, the strong correct ratio, the strong error ratio and the histogram parameter by using machine learning.

In step S421, the practical sensing voltages are supplied to the memory units and have different voltage values from each other. The practical sensing voltage may be different from the initial sensing voltage. Then, the initial sensing voltages are replaced with the practical sensing voltages and then steps S403 to S407 are performed.

In step S423, the initial sensing voltages or the practical sensing voltages by which the number of the memory units classified into the strong error region is smaller than the error threshold are recorded.

Figure 5:
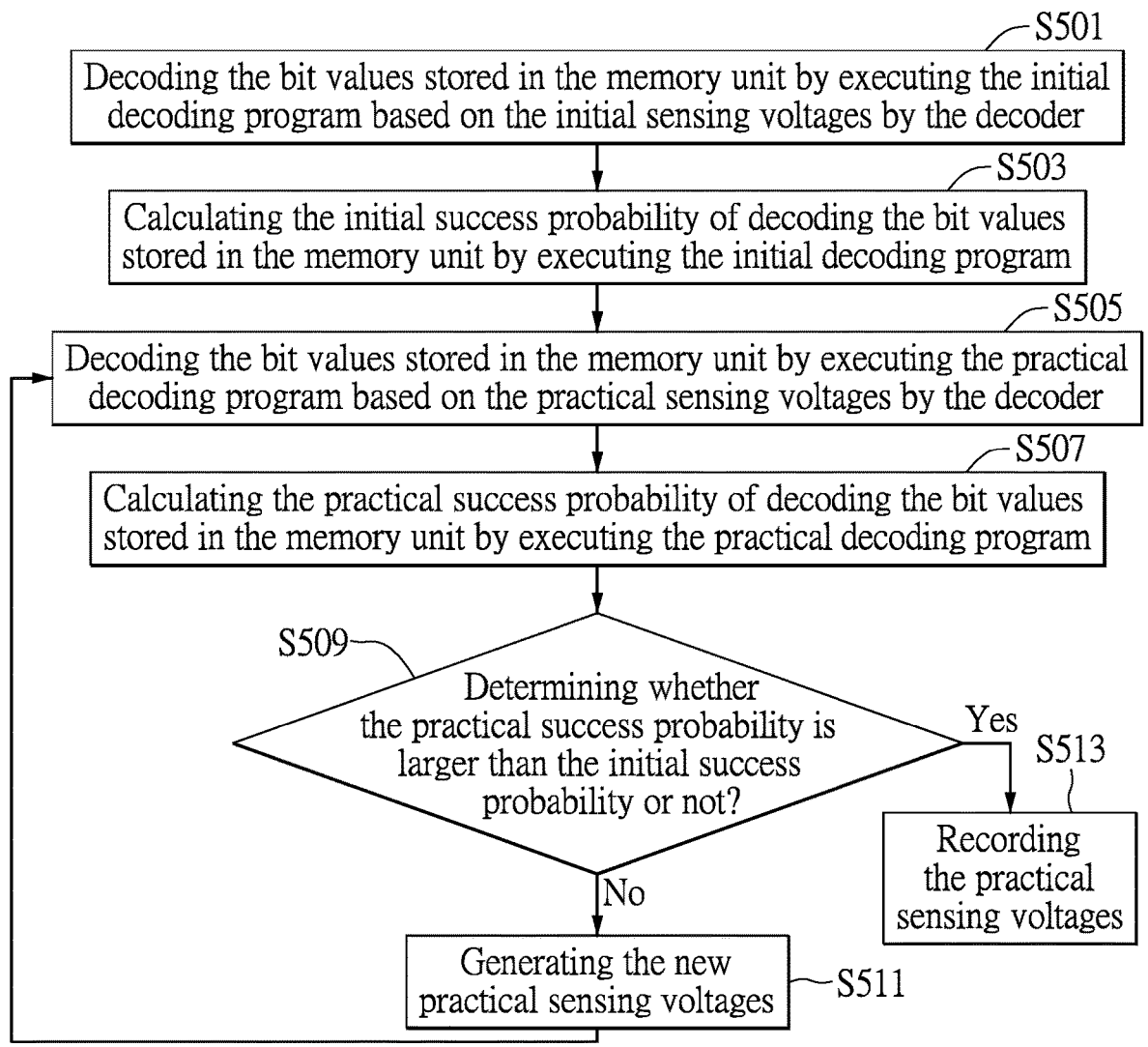
FIG. 5 is a flowchart of a method of training artificial intelligence to estimate sensing voltages for a storage device according to a fifth embodiment of the present disclosure.

Reference is made to FIG. 5, which is a flowchart of a method of training artificial intelligence to estimate sensing voltages for a storage device according to a fifth embodiment of the present disclosure. As shown in FIG. 5, the method of training artificial intelligence to estimate the sensing voltages for the storage device includes steps S501 to S513. The storage device includes the plurality of memory units each stores the one or more bit values each of which is logic "0" or "1".

In step S501, the bit values stored in the memory unit are decoded by executing an initial decoding program based on the initial sensing voltages by the decoder.

In step S503, an initial success probability of decoding the bit values stored in the memory unit by executing the initial decoding program is calculated.

In step S505, the bit values stored in the memory unit are decoded by executing a practical decoding program based on the practical sensing voltages by the decoder.

In step S507, a practical success probability of decoding the bit values stored in the memory unit by executing the practical decoding program is calculated.

In step S509, it is determined whether the practical success probability is larger than the initial success probability or not. If the practical success probability is not larger than the initial success probability, step S511 is performed. If the practical success probability is larger than the initial success probability, step S513 is performed.

In step S511, the new practical sensing voltages are generated and steps 505 to S509 are performed again based on the new practical sensing voltages.

In step S513, the practical sensing voltages are recorded.

Figure 6:
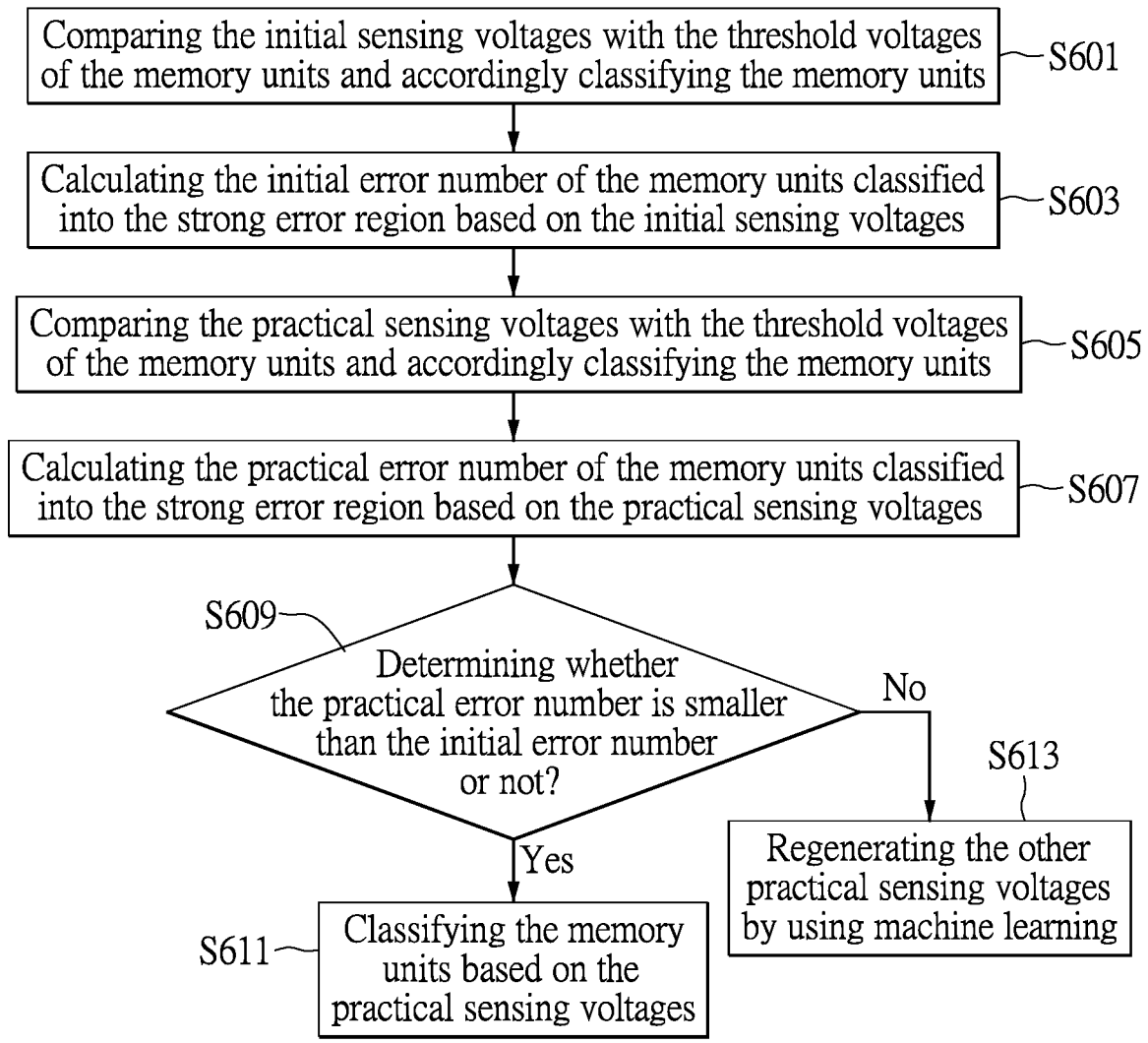
FIG. 6 is a flowchart of a method of training artificial intelligence to estimate sensing voltages for a storage device according to a sixth embodiment of the present disclosure.

Reference is made to FIG. 6, which is a flowchart of a method of training artificial intelligence to estimate sensing voltages for a storage device according to a sixth embodiment of the present disclosure. As shown in FIG. 6, the method of training artificial intelligence to estimate the sensing voltages for the storage device includes steps S601 to S613. The storage device includes the plurality of memory units and each of the plurality of memory units stores the one or more bit values each of which is logic "0" or "1".

In step S601, the threshold voltage of the memory unit is compared with the initial sensing voltages, and accordingly the memory unit is classified into the strong correct region, the weak correct region, the strong error region or the weak error region.

In step S603, an initial error number of the memory units classified into the strong error region based on the initial sensing voltages is calculated.

In step S605, the threshold voltage of the memory unit is compared with the practical sensing voltages, and accordingly the memory unit is classified into the strong correct region, the weak correct region, the strong error region or the weak error region.

In step S607, a practical error number of the memory units classified into the strong error region based on the practical sensing voltages is calculated.

In step S609, it is determined whether the practical error number is smaller than the initial error number or not. If the practical error number is smaller than the initial error number, step S611 is performed. If the practical error number is not smaller than the initial error number, step S613 is performed.

In step S611, the memory units are still classified based on the practical sensing voltages.

In step S613, the practical sensing voltages are generated by using machine learning by the artificial intelligence neural network system.

Figure 7:
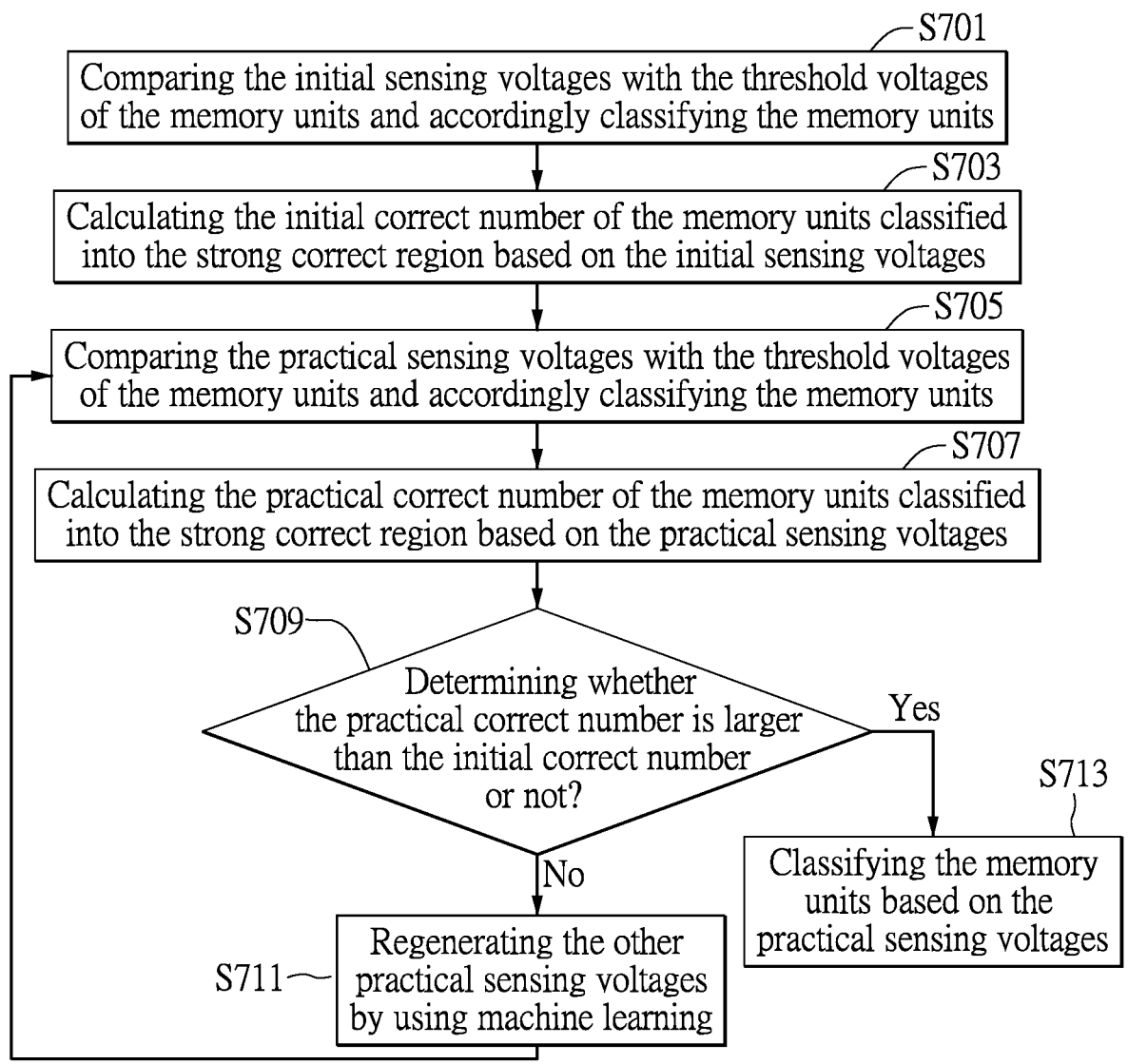
FIG. 7 is a flowchart of a method of training artificial intelligence to estimate sensing voltages for a storage device according to a seventh embodiment of the present disclosure.
Figure 9:
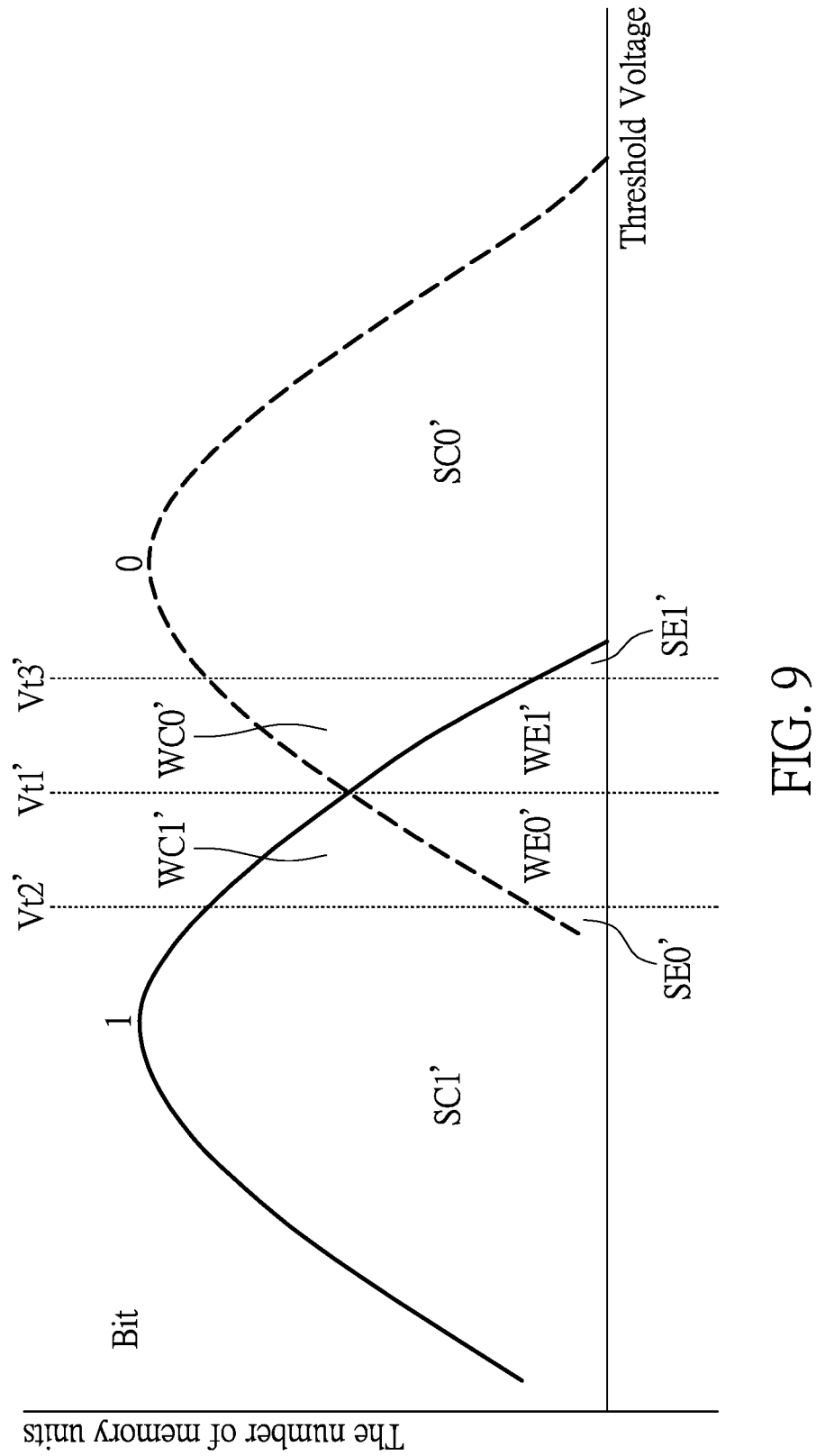
FIG. 9 is a graph of the number of the memory units of the storage device to which practical sensing voltages estimated by using the method of training artificial intelligence are supplied verse the threshold voltages of the memory units according to the embodiments of the present disclosure.

Reference is made to FIGS. 7 to 9. FIG. 7 is a flowchart of a method of training artificial intelligence to estimate sensing voltages for a storage device according to a seventh embodiment of the present disclosure; FIG. 8 is a graph of the number of the memory units of the storage device to which initial sensing voltages estimated by using the method of training artificial intelligence are supplied verse threshold voltages of the memory units according to the embodiments of the present disclosure; FIG. 9 is a graph of the number of the memory units of the storage device to which practical sensing voltages estimated by using the method of training artificial intelligence are supplied verse the threshold voltages of the memory units according to the embodiments of the present disclosure.

As shown in FIG. 7, the method of training artificial intelligence to estimate the sensing voltages for the storage device includes steps S701 to S713. The storage device includes the plurality of memory units and each of the plurality of memory units stores the one or more bit values each of which is logic "0" or "1".

In step S701, the threshold voltage of the memory unit is compared with the initial sensing voltages, and accordingly the memory unit is classified into the strong correct region, the weak correct region, the strong error region or the weak error region.

As shown in FIG. 8, the threshold voltage of the memory unit is compared with the initial sensing voltages Vt1, Vt2, Vt3, and accordingly the memory unit intending to store the bit value Bit of logic "1" is classified into the strong correct region SC1, the weak correct region WC1, the strong error region SE1 or the weak error region WE1, according to a comparison result of the threshold voltage and the initial sensing voltages Vt1, Vt2, Vt3. In addition, the memory unit intending to store the bit value Bit of logic "0" is classified into the strong correct region SC0, the weak correct region WC0, the strong error region SE0 or the weak error region WE0, according to a comparison result of the threshold voltage and the initial sensing voltages Vt1, Vt2, Vt3.

In step S703, the initial correct number of the memory units classified into the strong correct region based on the initial sensing voltages is calculated.

In step S705, the threshold voltage of the memory unit is compared with the practical sensing voltages, and accordingly the memory unit is classified into the strong correct region, the weak correct region, the strong error region or the weak error region.

For example, in the above embodiments, the initial sensing voltages Vt1, Vt2, Vt3 as shown in FIG. 8 may be adjusted into the practical sensing voltages Vt1', Vt2', Vt3' having different voltage values from the initial sensing voltages Vt1, Vt2, Vt3 as shown in FIG. 9. It is worth noting that the initial sensing voltage Vt1 is adjusted into the practical sensing voltage Vt1', such that a dotted line representing the initial sensing voltage Vt1' as shown in FIG. 9 crisscrosses with an intersection point or its vicinity of the curve representing the bit value Bit of the logic "1" and the curve representing the bit value Bit of the logic "0".

As shown in FIG. 9, the threshold voltage of the memory unit is compared with the practical sensing voltages Vt1', Vt2', Vt3'. The memory unit intending to store the bit value Bit of logic "1" is classified into a strong correct region SC1', a weak correct region WC1', a strong error region SE1' or a weak error region WE1', according to a comparison result of the threshold voltage and the initial sensing voltages Vt1', Vt2', Vt3'. The memory unit intending to store the bit value Bit of logic "0" is classified into a strong correct region SC0', a weak correct region WC0', a strong error region SE0' or a weak error region WE0', according to a comparison result of the threshold voltage and the practical sensing voltages Vt1', Vt2', Vt3'.

In step S707, a practical correct number of the memory units classified into the strong correct region based on the practical sensing voltages is calculated.

In step S709, it is determined whether the practical correct number is larger than the initial correct number or not. If the practical correct number is not larger than the initial correct number, step S711 is performed. If the practical correct number is larger than the initial correct number, step S713 is performed.

In step S711, the practical sensing voltages are regenerated by using machine learning by the artificial intelligence neural network system.

In step S713, the memory units are still classified based on the practical sensing voltages. As shown in FIG. 9, the memory units are classified based on the practical sensing voltages Vt1', Vt2', Vt3'.

The number of the memory units classified into the strong error region SE1' that is an area of the strong error region SE1' based on the practical sensing voltages Vt1', Vt2', Vt3' as shown in FIG. 9 is smaller than the number of the memory units classified into the strong error region SE1 that is an area of the strong error region SE1 based on the practical sensing voltages Vt1, Vt2, Vt3 as shown in FIG. 8.

In addition, the number of the memory units classified into the strong error region SE0' that is an area of the strong error region SE0' based on the practical sensing voltages Vt1', Vt2', Vt3' as shown in FIG. 9 is smaller than the number of the memory units classified into the strong error region SE0 that is an area of the strong error region SE0 based on the practical sensing voltages Vt1, Vt2, Vt3 as shown in FIG. 8.

In summary, the present disclosure provides the method of training artificial intelligence to estimate the sensing voltages for the storage device, by which the initial sensing voltages are adjusted to generate the practical sensing voltages to be supplied to the memory units. The memory units are more precisely classified into the storing states including the strong correct, the weak correct, the strong error and the weak error, etc., based on the practical sensing voltages. It is worth noting that the number of the memory units classified in the strong error region based on the practical sensing voltage can be significantly reduced. Therefore, the success probability of decoding the bit values stored in the memory units by executing a probability decoding algorithm such as a low density parity check code or other algorithms by the decoder can be increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated.

Alternative embodiments will become apparent to those skilled in the art to which the present disclosure pertains without departing from its spirit and scope.

What is claimed is:

1. A method of training artificial intelligence to estimate sensing voltages for a storage device including a plurality of memory units each storing one or more bit values, the method comprising the following steps:
   (a) supplying a plurality of initial sensing voltages having different voltage values to each of the memory units;
   (b) defining a plurality of storing states including a strong correct region, a weak correct region, a strong error region and a weak error region;
   (c) comparing the initial sensing voltages with the threshold voltage of each of the memory units, and accordingly classifying each of the memory units into the strong correct region, the weak correct region, the strong error region or the weak error region;
   (d) calculating a strong correct ratio of the number of the memory units classified in the strong correct region to the number of the memory units classified in the strong correct region and the weak correct region;
   (e) calculating a strong error ratio of the number of the memory units classified in the strong error region to the number of the memory units classified in the strong error region and the weak error region;
   (f) calculating the number of the memory units classified in the weak correct region and the weak error region to obtain a histogram parameter;
   (g) inputting the strong correct ratio, the strong error ratio and the histogram parameter to an artificial intelligence neural network system; and
   (h) using machine learning to adjust the initial sensing voltages based on the strong correct ratio, the strong error ratio and the histogram parameter to generate a plurality of practical sensing voltages replacing the initial sensing voltages, and then returning to step (a).

2. The method of claim 1, after step (c) and before step (d), further comprising steps of:
   (i) decoding the bit value stored in each of the memory units by a decoder; and
   (j) determining whether the bit value is successfully decoded by the decoder or not, in response to the bit value being successfully decoded, recording the initial sensing voltages and classifying the memory units based on the initial sensing voltages, in response to the bit value being not successfully decoded, performing steps (d) to (h) sequentially.

3. The method of claim 1, after step (c) and before step (d), further comprising steps of:
   (k) decoding the bit value stored in each of the memory units by a decoder; and
   (l) determining whether each of the memory units is correctly classified into the storing state based on the initial sensing voltages according to a success probability of decoding the bit values by the decoder, in response to each of the memory units being correctly classified into the storing state, recording the initial sensing voltages and classifying the memory units based on the initial sensing voltages, in response to each of the memory units being not classified correctly into the storing state, performing steps (d) to (h) sequentially.

4. The method of claim 1, after step (h), further comprising steps of:
   (m) decoding the bit value stored in each of the memory units by a decoder; and (n) determining whether each of the memory units is correctly classified into the storing state based on the practical sensing voltages according to a success probability of decoding the one or more bit values, in response to each of the memory units being correctly classified into the storing state, recording the practical sensing voltages and classifying the memory units based on the practical sensing voltages, in response to each of the memory units being not classified correctly into the storing state, performing steps (d) to (h) sequentially to generate other practical sensing voltages.

5. The method of claim 1, further comprising steps of:
(o) decoding the bit values stored in each of the memory units by executing an initial decoding program based on the initial sensing voltages by a decoder;
(p) calculating an initial success probability of decoding the bit values stored in each of the memory units by executing the initial decoding program by the decoder;
(q) decoding the bit values stored in each of the memory units by executing a practical decoding program based on the practical sensing voltages by the decoder;
(r) calculating a practical success probability of decoding the bit values stored in each of the memory units by executing the practical decoding program by the decoder; and
(s) determining whether the practical success probability is larger than the initial success probability or not, in response to the practical success probability being larger than the initial success probability, recording the practical sensing voltages and classifying the memory units based on the practical sensing voltages, in response to the practical success probability being not larger than the initial success probability, performing steps (d) to (h) sequentially to generate other practical sensing voltages.

6. The method of claim 1, after step (c) and before step (d), further comprising steps of:
(t) calculating an initial error number of the memory units classified into the strong error region based on the initial sensing voltages;
(u) determining whether the initial error number is smaller than an error threshold or not, in response to the initial error number being smaller than the error threshold, classifying the memory units based on the initial sensing voltages, in response to the initial error number being not smaller than the error threshold, performing steps (d) to (h) sequentially.

7. The method of claim 1, further comprising steps of:
(v) calculating a practical error number of the memory units classified into the strong error region based on the practical sensing voltages; and
(w) determining whether the practical error number is smaller than an error threshold or not, in response to the practical error number being smaller than the error threshold, classifying the memory units based on the practical sensing voltages, in response to the practical error number being not smaller than the error threshold, performing steps (d) to (h) sequentially to generate other practical sensing voltages.

8. The method of claim 1, further comprising steps of:
(x) calculating a practical error number of the memory units classified into the strong error region based on the practical sensing voltages;
(y) calculating an initial error number of the memory units classified into the strong error region based on the initial sensing voltages; and
(z) determining whether the practical error number is smaller than the initial error number or not, in response to the practical error number being smaller than the initial error number, classifying the memory units based on the practical sensing voltages, in response to the practical error number being not smaller than the initial error number, performing sequentially steps (d) to (h) to generate other practical sensing voltages.

9. The method of claim 1, further comprising steps of:
(aa) calculating a practical correct number of the memory units classified into the strong correct region based on the practical sensing voltages;
(bb) calculating an initial correct number of the memory units classified into the strong correct region based on the initial sensing voltages; and
(cc) determining whether the practical correct number is larger than the initial correct number or not, in response to the practical correct number being larger than the initial correct number, classifying the memory units based on the practical sensing voltages, in response to the practical correct number being not larger than the initial correct number, performing steps (d) to (h) sequentially to generate other practical sensing voltages.

10. The method of claim 1, further comprising steps of:
(dd) obtaining a process environment variable associated with a process in which the storage device accesses the one or more bit values;
(ee) inputting the process environment variable, the strong correct ratio, the strong error ratio and the histogram parameter to the artificial intelligence neural network system; and
(ff) using machine learning to analyze the practical sensing voltages based on the process environment variable, the strong correct ratio, the strong error ratio and the histogram parameter.

* * * * *